(12) United States Patent
Liu et al.

(10) Patent No.: US 11,251,402 B2
(45) Date of Patent: Feb. 15, 2022

(54) THIN-FILM ENCAPSULATION STRUCTURES, MANUFACTURING METHODS, AND DISPLAY APPARATUS THEREWITH

(71) Applicant: Kunshan Go-Visionox Opto-Electronics Co., Ltd., Kunshan (CN)

(72) Inventors: Shengfang Liu, Kunshan (CN); Xueyuan Li, Kunshan (CN); Ping Zhu, Kunshan (CN); Ke Zhu, Kunshan (CN); Xiaopeng Lv, Kunshan (CN); Yanqin Song, Kunshan (CN)

(73) Assignee: Kunshan Go-Visionox Opto-Electronics Co., Ltd., Kunshan (CN)

( * ) Notice: Subject to any disclaimer, the term of this patent is extended or adjusted under 35 U.S.C. 154(b) by 120 days.

(21) Appl. No.: 16/328,734

(22) PCT Filed: Apr. 28, 2018

(86) PCT No.: PCT/CN2018/085172
§ 371 (c)(1),
(2) Date: Feb. 27, 2019

(87) PCT Pub. No.: WO2019/041866
PCT Pub. Date: Mar. 7, 2019

(65) Prior Publication Data
US 2021/0336217 A1    Oct. 28, 2021

(30) Foreign Application Priority Data

Aug. 28, 2017  (CN) .......................... 201710752001.5

(51) Int. Cl.
| | | |
|---|---|---|
| *H01L 51/00* | (2006.01) | |
| *H01L 51/52* | (2006.01) | |
| *H01L 51/56* | (2006.01) | |

(52) U.S. Cl.
CPC .......... *H01L 51/5256* (2013.01); *H01L 51/56* (2013.01)

(58) Field of Classification Search
CPC ........................... H01L 51/5256; H01L 51/56
See application file for complete search history.

(56) References Cited

U.S. PATENT DOCUMENTS

| | | |
|---|---|---|
| 7,629,739 B2 | 12/2009 | Han et al. |
| 9,966,570 B2 | 5/2018 | Kamiya et al. |
| | (Continued) | |

FOREIGN PATENT DOCUMENTS

| | | |
|---|---|---|
| CN | 1700826 A | 11/2005 |
| CN | 1784102 A | 6/2006 |
| | (Continued) | |

OTHER PUBLICATIONS

European Search Report dated Jan. 30, 2020, in the corresponding EP application(application No. 18849544.4).

(Continued)

*Primary Examiner* — Victor A Mandala
*Assistant Examiner* — Colleen E Snow
(74) *Attorney, Agent, or Firm* — Kilpatrick Townsend & Stockton

(57) ABSTRACT

A thin-film encapsulation structure includes a number of inorganic film layers and at least one organic film layer laminated alternately at one side of an organic light-emitting diode. The number of inorganic film layers include N inorganic film layers including first to N-th inorganic film layers arranged sequentially from inside to outside, N≥2. At (Continued)

least the first inorganic film layer has a refractive index increasing gradually from inside to outside.

17 Claims, 1 Drawing Sheet

(56) References Cited

U.S. PATENT DOCUMENTS

| | | | |
|---|---|---|---|
| 10,061,416 | B2 | 8/2018 | Zhu |
| 2005/0285510 | A1 | 12/2005 | Han |
| 2006/0183305 | A1 | 8/2006 | Gao et al. |
| 2011/0097533 | A1 | 4/2011 | Li et al. |
| 2012/0248422 | A1 | 10/2012 | Mine et al. |
| 2013/0156994 | A1 | 6/2013 | Hsu |
| 2014/0049156 | A1 | 2/2014 | Lee |
| 2014/0138634 | A1 | 5/2014 | Lee |
| 2015/0034937 | A1 | 2/2015 | Ikeda et al. |
| 2015/0123086 | A1 | 5/2015 | Lee et al. |
| 2015/0340653 | A1 | 11/2015 | Yang |
| 2016/0190519 | A1 | 6/2016 | Cho et al. |
| 2016/0315290 | A1 | 10/2016 | Zhang et al. |
| 2016/0380235 | A1 | 12/2016 | Kim |
| 2017/0125732 | A1 | 5/2017 | Lee et al. |
| 2017/0244066 | A1 | 8/2017 | Kamiya et al. |
| 2017/0373275 | A1 | 12/2017 | Frantz et al. |

FOREIGN PATENT DOCUMENTS

| | | |
|---|---|---|
| CN | 106158905 A | 11/2016 |
| CN | 106298848 A | 1/2017 |
| CN | 106816462 A | 6/2017 |
| CN | 106887530 A | 6/2017 |
| JP | 2005353589 A | 12/2005 |
| JP | 2006236997 A | 9/2006 |
| JP | 2007012410 A | 1/2007 |
| JP | 2010244697 A | 10/2010 |
| JP | 2012216452 A | 11/2012 |
| JP | 2017147191 A | 8/2017 |
| KR | 20140083411 A | 7/2014 |
| KR | 20150052490 A | 5/2015 |
| KR | 20160082864 A | 7/2016 |
| TW | 201421666 A | 6/2014 |
| TW | 201525830 A | 7/2015 |
| TW | 201545389 A | 12/2015 |
| TW | 201620177 A | 6/2016 |
| TW | 201628851 A | 8/2016 |
| TW | 201631805 A | 9/2016 |
| WO | 2013065213 A1 | 5/2013 |

OTHER PUBLICATIONS

F Rebib et al., "Determination of optical properties of a-SiOxNy thin films by ellipsometric and UV-visible spectroscopies", 5 pages.
Office Action of JP Patent Application No. 2019-538433.
International Search Report of PCT/CN2018/085172.
Office Action of KR Patent Application No. 10-2019-7021219.
Office Action of EP Patent Application No. 18849544.4.
CN First Office Action dated May 22, 2019 in the corresponding CN application (application No. 201710752001.5).
CN Second Office Action dated Jul. 29, 2019 in the corresponding CN application (application No. 201710752001.5).
TW Office Action dated Jul. 24, 2019 in the corresponding TW application (application No. 107116227).
TW First Office Action dated Oct. 21, 2018 in the corresponding TW application (application No. 107116227).

THIN-FILM ENCAPSULATION STRUCTURES, MANUFACTURING METHODS, AND DISPLAY APPARATUS THEREWITH

CROSS-REFERENCE TO RELATED APPLICATIONS

This application is a U.S. national Stage of International Application No. PCT/CN2018/085172, filed on Apr. 28, 2018, designating the United States, which claims priority to Chinese Patent Application No. 201710752001.5, filed with the Chinese Patent Office on Aug. 28, 2017 and entitled "THIN-FILM ENCAPSULATION STRUCTURE AND DISPLAY APPARATUS THEREWITH", the content of each of which is hereby incorporated by reference in its entirety.

FIELD

The disclosure relates to the field of display technology, and more particularly, to thin-film encapsulation structures, manufacturing methods, and display apparatus therewith.

BACKGROUND

The encapsulation technology is a common technology for organic light-emitting diode (OLED). The object of encapsulating an organic light-emitting diode is to protect the organic light-emitting diode, and more particularly, to prevent a light-emitting layer of the organic light-emitting diode from damages caused by moisture or oxygen. Usually, OLED is encapsulated by way of encapsulation with glass powders, encapsulation with a cover attached with drying sheets or the like to improve the moisture and oxygen barrier capabilities. However, these encapsulation structures can only be used in rigid displays but not in flexible displays, resulting in limiting the development of flexible display technologies.

SUMMARY

In view of the above, the present application provides a thin-film encapsulation structure for improving moisture and oxygen barrier capabilities. Furthermore, the present application further provides methods and display apparatus with such thin-film encapsulation structure.

An aspect of the present disclosure provides a thin-film encapsulation structure. The thin-film encapsulation structure includes a plurality of inorganic film layers and at least one organic film layer which are laminated alternately at one side of an organic light-emitting diode. The plurality of inorganic film layers include N inorganic film layers including first to N-th inorganic film layers arranged sequentially from inside to outside, N≥2. In such a context, at least the first inorganic film layer has a refractive index increasing gradually from inside to outside.

In an embodiment, the first inorganic film layer includes M sub-layers including first to M-th sub-layers arranged sequentially from inside to outside, M≥2. The M sub-layers of the first inorganic film layer have refractive indexes increasing sub-layer by sub-layer from the first sub-layer to the M-th sub-layer.

In an embodiment, the M sub-layers of the first inorganic film layer have thicknesses increasing sub-layer by sub-layer from the first sub-layer to the M-th sub-layer.

In an embodiment, each of the plurality of inorganic film layers has a refractive index increasing gradually from inside to outside.

In an embodiment, the plurality of inorganic film layers have refractive indexes increasing layer by layer from the first inorganic film layer to the N-th inorganic film layer.

In an embodiment, one of the plurality of inorganic film layers closest to the organic light-emitting diode in the thin-film encapsulation structure is the first inorganic film layer.

In an embodiment, the first inorganic film layer has a refractive index ranging from 1.45 to 1.91.

In an embodiment, the refractive index of the first sub-layer of the first inorganic film layer ranges from 1.45 to 1.81.

In an embodiment, one of the plurality of inorganic film layers farthest away from the organic light-emitting diode in the thin-film encapsulation structure is the N-th inorganic film layer, and the N-th inorganic film layer has a refractive index ranging from 1.63 to 1.91.

According to another aspect of the present disclosure, further provided is a display apparatus, including a substrate, a display device and the thin-film encapsulation structure as described above.

The thin-film encapsulation structure described above includes a plurality of inorganic film layers and an organic film layer which are laminated alternately at one side of the organic light-emitting diode. At least the first inorganic film layer has a refractive index increasing gradually from inside to outside. At least one sub-layer of the first inorganic film layer adjacent to the organic light-emitting diode is formed by a deposition method with a relatively lower temperature or a relatively lower power, so as to be able to reduce damage to the organic light-emitting diode during the deposition. At least one sub-layer of the first inorganic film layer away from the organic light-emitting diode forms an inorganic layer with a higher refractive index, less deficiencies and a higher density by a deposition method with a relatively higher temperature or a relatively higher power, so as to be able to improve the moisture and oxygen barrier capabilities, considerably improving the storage life of the packaged product.

BRIEF DESCRIPTION OF THE DRAWINGS

In order to more clearly illustrate the technical solutions of the embodiments of the present application or in the prior art, the drawings used in the embodiments will be briefly described below. It is obvious that the drawings in the following description are merely some of the embodiments described in the present disclosure. Some other embodiments of the present disclosure can also be obtained by those skilled in the art from these drawings.

DETAILED DESCRIPTION OF THE INVENTION

In order to make the objects, technical solutions and advantages of the present disclosure more comprehensible, the thin-film encapsulation structure of the present disclosure and the display device therewith are further described in detail below with reference to the accompanying drawings. It should be understood that the detailed embodiments described herein is merely to set forth the present disclosure, but not intended to limit the present disclosure.

Figure 1:
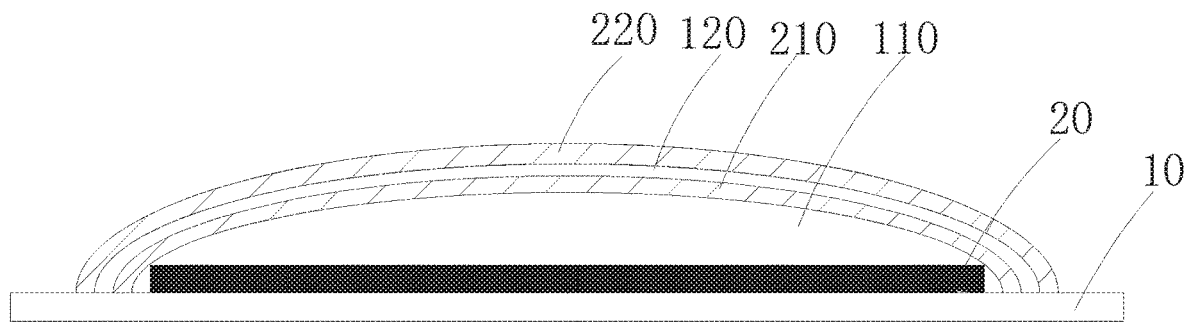
FIG. 1 is a schematic structural diagram of a display apparatus according to an embodiment of the present disclosure.
Figure 4:
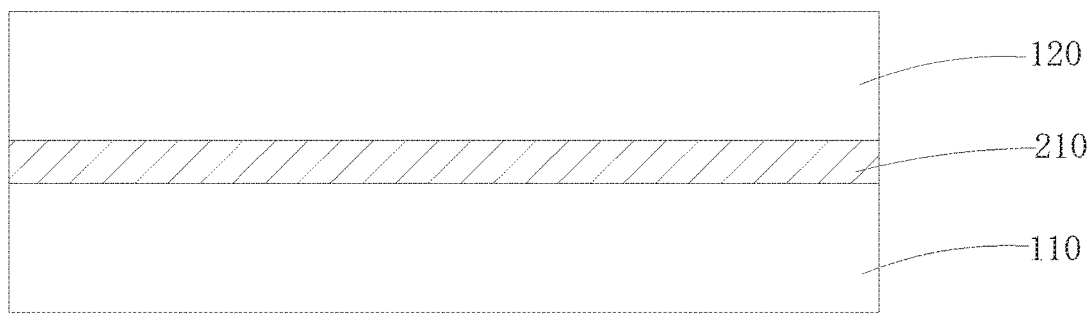
FIG. 4 is a schematic diagram of a thin-film encapsulation structure according to Comparative Example 1.

Referring to FIG. 1 and FIG. 4, the thin-film encapsulation structure of the present disclosure includes a plurality of inorganic film layers and at least one organic film layer laminated alternately at one side of an organic light-emitting diode, for example a display device (such as OLED device). The plurality of inorganic film layers include N inorganic film layers including first to N-th inorganic film layers arranged sequentially from inside to outside, N≥2. In such a context, at least the first inorganic film layer has a refractive index increasing gradually from inside to outside.

The refractive index relates to the quality of the inorganic film layer, that is, the denser the thin-film, the higher the refractive index is, thus accordingly the higher the moisture and oxygen barrier capabilities are. The refractive index of the first inorganic film layer arranged on the one side of the organic light-emitting diode in the thin-film encapsulation structure is configured to increase gradually from inside to outside. At least one sub-layer of the first inorganic film layer adjacent to the organic light-emitting diode may be formed by a deposition method with a relatively lower temperature or a relatively lower power, so as to be able to reduce damage to the organic light-emitting diode during the deposition. At least one sub-layer of the first inorganic film layer away from the organic light-emitting diode may be formed by a deposition method with a relatively higher temperature, so that the sub-layer of the inorganic film layer has a higher refractive index, less deficiencies and a higher density, to be able to improve the moisture and oxygen barrier capabilities of the encapsulation structure, considerably improving the storage life of the packaged product.

When depositing the first inorganic film layer, if the temperature is too high during the deposition, the organic light-emitting diode may be damaged, but if the temperature is too low, deposited atomic groups do not have sufficient energy migrate, resulting in more defects. In the present disclosure, the first inorganic film layer with the relatively lower refractive index is firstly deposited on and adjacent to the organic light-emitting diode. Since the first inorganic film layer may be formed by the deposition under a condition of a lower temperature, for example between 30° C. and 60° C., and of a lower power set according to the device conditions, so as to reduce damage to the organic light-emitting diode. Meanwhile, the formed first inorganic film layer adjacent to the organic light-emitting diode covers the organic light-emitting diode, provides a better interface environment for a further inorganic film layer to be deposited next, and further facilitates that the subsequent deposition with a higher temperature is able to prepare the first inorganic film layer having a higher refractive index. The first inorganic film layer having the higher refractive index is of higher density and less deficiencies and has higher moisture and oxygen barrier capabilities.

It should be noted that the method of forming the first inorganic film layer by deposition may be a magnetron sputtering method, an atomic layer deposition method, an electron beam evaporation method, a plasma enhanced chemical vapor deposition method, or the like. As an optional implementation, the first inorganic film layer includes M sub-layers including first to M-th sub-layers arranged sequentially from inside to outside, M≥2. The first inorganic film layer has a refractive index increasing sub-layer by sub-layer from the first sub-layer to the M-th sub-layer. The remaining inorganic film layers may be configured as the same.

Taking account in encapsulating processes, the first sub-layer having a relatively lower refractive index is generally prepared by using a process which causes less damage to the organic light-emitting diode. Damage to the organic light-emitting diode can be reduced due to low damaging processes applying the condition parameters such as lower power and lower temperature to the first sub-layer serving as the first encapsulation film.

A second sub-layer having an increased refractive index is superimposed on a homogeneous film layer having a lower refractive index, i.e., the first sub-layer. Since the second sub-layer and the first sub-layer are homogeneous film layers, the film structures of both the two sub-layers are more compatible and the bonding force is higher. The second sub-layer is prepared by using a process with condition parameters such as a higher power and a higher temperature to improve the film quality, reducing the internal defects in the second sub-layer having the higher refractive index, causing the second sub-layer denser and to have higher moisture and oxygen barrier capabilities. Although there is a higher power and a higher temperature when preparing the second sub-layer, the process of depositing the second sub-layer does not cause damage to the organic light-emitting diode due to the protection effect from the first sub-layer on the organic light-emitting diode. Therefore, the bonding of the first sub-layer and the second sub-layer can achieve a combined effect of not only improving the moisture and oxygen barrier capabilities, but also avoiding the damage to the OLED device.

Similarly, the third sub-layer to the M-th sub-layer having refractive indexes increasing sub-layer by sub-layer are sequentially deposited in a superimposing manner, and the temperature and power during the deposition process can be further increased so as to obtain a higher quality film layer to further improve the moisture and oxygen barrier capabilities.

By a multi-step deposition of the homogeneous film layers with the increasing refractive indexes serving as the first sub-layer to the M-th sub-layer, the diffusion and extension of defects in the respective sub-layers can be effectively prevented, and the film layer with the higher refractive index is denser and its stress can also be gradually reduced.

Optionally, in a film encapsulation process, the inorganic material is provided by using a multi-step deposition method to gradually increase the refractive indexes of the same inorganic material by changing the deposition conditions gradually. The density of the inorganic material increases gradually, and the internal defects are reduced, so that the first inorganic film layer has a refractive index increasing gradually from inside to outside.

Optionally, the inorganic material may be any one of $SiO_x$, $SiN_x$, $TiO_2$, $Al_2O_3$, or a mixture thereof.

For example, in the film encapsulation process, an inorganic material is first deposited on one side of the organic light-emitting diode by using a chemical vapor deposition (CVD). A first sub-layer having a lower refractive index is firstly generated as a buffer layer, and in turn a homogeneous film layer having a higher refractive index is generated as the second sub-layer with a higher refractive index. The first film layer having the lower refractive index is formed by using a process with a low temperature, for example, 50° C., and with a low power, for example, 300 W, to reduce damage to the OLED device at the bottom. The second film layer having the higher refractive index is formed by using a process with a high temperature, for example, 80° C. and with a low power, for example, 800 W, to improve the film layer quality of the second layer. As an optional implementation, thicknesses of the first sub-layer to the M-th sub-layer increase gradually. The gradual increase in the thicknesses can ensure that the film layer having the higher refractive index and the better density is thicker, and has a better effect of barring moisture and oxygen.

As an optional implementation, each of the inorganic film layers in the thin-film encapsulation structure has a refractive index increasing gradually from inside to outside.

For example, the thin-film encapsulation structure includes the first inorganic film layer, the first organic layer, and the second inorganic film layer which are sequentially superimposed from inside to outside. The first inorganic film layer has a refractive index gradually increasing from inside to outside, and the second inorganic film layer also has a refractive index gradually increasing from inside to outside.

The second inorganic film layer includes a first sub-layer and a second sub-layer, and the first sub-layer has a refractive index smaller than that of the second sub-layer. Accordingly, the refractive index of the first sub-layer is lower and the first sub-layer can be deposited by using a process with a relatively lower temperature or a lower power, to reduce damage to the first organic layer. The refractive index of the second sub-layer is higher and can be deposited by using a process with a relatively higher temperature and a higher power, without causing damage to the first organic layer. Meanwhile, since the second sub-layer is formed by using the higher temperature or the higher power and the first sub-layer serves as a buffer layer, so the second sub-layer is denser and has less defects, and higher moisture and oxygen barrier capabilities. Moreover, since the second sub-layer is located on the surface of the encapsulation structure, it is more necessary to configure it to be a thin-film layer having a high refractive index, a high density, and high moisture and oxygen barrier capabilities.

By increasing the refractive indexes of all the inorganic film layers from inside to outside gradually, that is, the closer to the surface of the encapsulation structure, the higher the refractive index of the film layer is, and the higher the moisture and oxygen barrier capabilities are, which is more advantageous for improving the service life of the encapsulation structure.

As an optional implementation, the encapsulation structure has refractive indexes increasing layer by layer from the first inorganic film layer to the N-th inorganic film layer.

As an optional implementation, one of the plurality of inorganic film layers closest to the organic light-emitting diode in the thin-film encapsulation structure is the first inorganic film layer. The refractive index of the first sub-layer of the first inorganic film layer is low, and damage to the organic light-emitting diode when preparing the first inorganic film layer can be reduced by using a low damaging process with condition parameters such as a low power and a low temperature.

As an optional implementation, the refractive index of the first inorganic film layer ranges from 1.45 to 1.91.

As an optional implementation, the refractive index of the first sub-layer of the first inorganic film layer ranges from 1.45 to 1.80. Optionally, the deposition temperature of the first sub-layer of the first inorganic film layer ranges from 30° C. to 60° C., and a lower power is selected as the deposition power according to the actual conditions of the equipment.

As an optional implementation, the inorganic film layer of the plurality of inorganic film layers farthest from the organic light-emitting diode in the thin-film encapsulation structure is the N-th inorganic film layer, and the refractive index of the N-th inorganic film layer ranges from 1.63 to 1.90.

Continue to refer to FIG. 1. The display apparatus of the present disclosure includes a substrate 10, a display device 20 and a thin-film encapsulation structure. The display device 20 is an organic light-emitting diode. The thin-film encapsulation structure is arranged at one side of the display device 20 away from the substrate 10, configured to package this display device 20. The thin-film encapsulation structure includes a first inorganic film layer 110, a first organic film layer 210, a second inorganic film layer 120 and a second organic film layer 220 which are laminated sequentially from inside to outside.

Example 1

Figure 2:
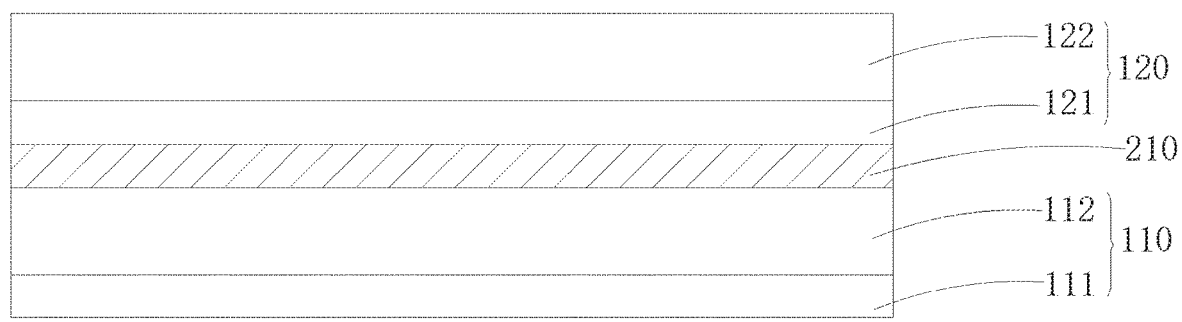
FIG. 2 is a schematic diagram of a thin-film encapsulation structure according to Example 1 of the present disclosure.

Referring to FIG. 2, the thin-film encapsulation structure in this example includes a first inorganic film layer 110, a first organic film layer 210 and a second inorganic film layer 120 which are laminated sequentially at one side of the organic light-emitting diode from inside to outside.

The first inorganic film layer 110 has sequentially from inside to outside a first sub-layer 111 of the first inorganic film layer and a second sub-layer 112 of the first inorganic film layer which are made of silicon nitride. The first sub-layer 111 of the first inorganic film layer has a refractive index of 1.78, and a thickness of 200 nm, and the second sub-layer 112 of the first inorganic film layer has a refractive index of 1.85, and a thickness of 800 nm.

The second inorganic film layer 120 has sequentially from inside to outside a first sub-layer 121 of the second inorganic film layer and a second sub-layer 122 of the second inorganic film layer which are made of silicon nitride. The first sub-layer 121 of the second inorganic film layer and the second sub-layer 122 of the second inorganic film layer have refractive indexes of 1.79 and 1.85 respectively, and thicknesses of 200 nm and 800 nm respectively.

The display apparatus packaged by the thin-film encapsulation structure in this example is measured under a test condition of a high temperature at 60° C. and a high humidity at 90H that the storage life is more than 760 h.

Example 2

Figure 3:
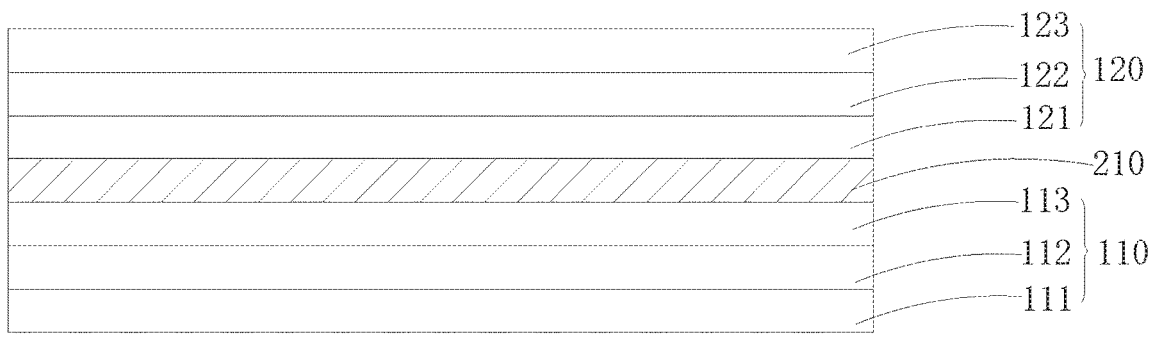
FIG. 3 is a schematic diagram of a thin-film encapsulation structure according to Example 2 of the present disclosure.

Referring to FIG. 3, the thin-film encapsulation structure in this example includes a first inorganic film layer 110, a first organic film layer 210 and a second inorganic film layer 120 which are laminated at one side of the organic light-emitting diode sequentially from inside to outside.

The first inorganic film layer 110 has sequentially from inside to outside a first sub-layer 111 of the first inorganic film layer, a second sub-layer 112 of the first inorganic film layer and a third sub-layer 113 of the first inorganic film layer which are made of silicon nitride. The first sub-layer 111 of the first inorganic film layer, the second sub-layer 112 of the first inorganic film layer, and the third sub-layer 113 of the first inorganic film layer have refractive indexes of 1.76, 1.83, and 1.85 respectively, and thicknesses of 100 nm, 400 nm, and 500 nm respectively.

The second inorganic film layer 120 has sequentially from inside to outside a first sub-layer 121 of the second inorganic film layer, a second sub-layer 122 of the second inorganic film layer and a third sub-layer 123 of the second inorganic film layer which are made of silicon nitride. The first sub-layer 121 of the second inorganic film layer, the second sub-layer 122 of the second inorganic film layer, and the third sub-layer 123 of the second inorganic film layer have refractive indexes of 1.76, 1.83, and 1.87 respectively, and thicknesses of 100 nm, 400 nm, and 500 nm respectively.

The display apparatus packaged by the thin-film encapsulation structure of this example is measured under a test condition at 60° C. and at 90H that the storage life is 870 h.

Example 3

The thin-film encapsulation structure of this example includes a first inorganic film layer, a first organic film layer and a second inorganic film layer which are laminated at one side of the organic light-emitting diode sequentially from inside to outside.

The first inorganic film layer has sequentially from inside to outside a first sub-layer of the first inorganic film layer, a second sub-layer of the first inorganic film layer and a third sub-layer of the first inorganic film layer which are made of silicon nitride. The first sub-layer of the first inorganic film layer, the second sub-layer of the first inorganic film layer, and the third sub-layer of the first inorganic film layer have refractive indexes of 1.76, 1.83, and 1.85 respectively, and thicknesses of 200 nm, 500 nm, and 600 nm respectively.

The second inorganic film layer is a sub-layer having a uniform refractive index, which is made of silicon nitride. The second inorganic film layer has a refractive index of 1.87 and a thickness of 1000 nm.

The display apparatus packaged by the thin-film encapsulation structure of this example is measured under a test condition of a high temperature at 60° C. and a high humidity at 90H that the storage life is more than 760 h.

Example 4

The thin-film encapsulation structure of this example includes a first inorganic film layer, a first organic film layer and a second inorganic film layer which are laminated at one side of the organic light-emitting diode sequentially from inside to outside.

The first inorganic film layer has sequentially from inside to outside a first sub-layer of the first inorganic film layer and a second sub-layer of the first inorganic film layer which are made of silicon nitride. The first sub-layer of the first inorganic film layer and the second sub-layer of the first inorganic film layer have refractive indexes of 1.76 and 1.80 respectively, and thicknesses of 500 nm and 600 nm respectively.

The second inorganic film layer has sequentially from inside to outside a first sub-layer of the second inorganic film layer and a second sub-layer of the second inorganic film layer which are made of silicon nitride. The first sub-layer of the second inorganic film layer and the second sub-layer of the second inorganic film layer have refractive indexes of 1.83 and 1.87 respectively, and thicknesses of 500 nm, 600 nm respectively.

The display apparatus packaged by the thin-film encapsulation structure of this example is measured under a test condition of a high temperature at 60° C. and a high humidity at 90H that the storage life is more than 760 h.

Comparative Example 1

Referring to FIG. 4, the thin-film encapsulation structure in this comparative example includes a first inorganic film layer 110, a first organic film layer 210 and a second inorganic film layer 120 which are laminated at one side of the organic light-emitting diode sequentially from inside to outside.

The first inorganic film layer 110 is an inorganic film layer having a uniform refractive index, which is made of silicon nitride. The first inorganic film layer 110 has a uniform refractive index of 1.78, and a thickness of 1,000 nm which is equal to the thickness of the first inorganic film layer in the example 1.

The second inorganic film layer 120 is an inorganic film layer having a uniform refractive index, which is made of silicon nitride. The second inorganic film layer 120 has a uniform refractive index of 1.78, and a thickness of 1,000 nm which is equal to the thickness of the second inorganic film layer in the example 1.

The display apparatus packaged by the thin-film encapsulation structure of this comparative example is measured under a test condition at 60° C. and at 90H that the storage life is 240 h.

Comparative Example 2

The thin-film encapsulation structure in this comparative example includes a first inorganic film layer, a first organic film layer and a second inorganic film layer which are laminated at one side of the organic light-emitting diode sequentially from inside to outside.

The first inorganic film layer has sequentially from inside to outside a first sub-layer of the first inorganic film layer and a second sub-layer of the first inorganic film layer which are made of silicon nitride. The first sub-layer of the first inorganic film layer and the second sub-layer of the first inorganic film layer have refractive indexes of 1.85 and 1.78 respectively, and thicknesses of 200 nm and 800 nm respectively.

The second inorganic film layer has sequentially from inside to outside a first sub-layer of the second inorganic film layer and a second sub-layer of the second inorganic film layer which are made of silicon nitride. The first sub-layer of the second inorganic film layer and the second sub-layer of the second inorganic film layer have refractive indexes of 1.85 and 1.79 respectively, and thicknesses of 200 nm and 800 nm respectively.

The display apparatus packaged by the thin-film encapsulation structure of this comparative example is measured under a test condition at 60° C. and at 90H that the storage life is 350 h.

Comparative Example 3

The thin-film encapsulation structure in this comparative example includes a first inorganic film layer, a first organic film layer and a second inorganic film layer which are laminated at one side of the organic light-emitting diode sequentially from inside to outside.

The first inorganic film layer has sequentially from inside to outside a first sub-layer of the first inorganic film layer, a second sub-layer of the first inorganic film layer and a third sub-layer of the first inorganic film layer which are made of silicon nitride. The first sub-layer of the first inorganic film layer, the second sub-layer of the first inorganic film layer, and the third sub-layer of the first inorganic film layer have refractive indexes are of 1.85, 1.83, and 1.76 respectively, and thicknesses of 200 nm, 500 nm, 600 nm respectively.

The second inorganic film layer is a sub-layer having a uniform refractive index, which is made of silicon nitride.

The second inorganic film layer has a refractive index of 1.87 and a thickness of 1000 nm.

The display apparatus packaged by the thin-film encapsulation structure of this comparative example is measured under a test condition at 60° C. and at 90H that the storage life is 380 h.

Comparative Example 4

The thin-film encapsulation structure in this comparative example includes a first inorganic film layer, a first organic film layer and a second inorganic film layer which are laminated at one side of the organic light-emitting diode sequentially from inside to outside.

The first inorganic film layer has sequentially from inside to outside a first sub-layer of the first inorganic film layer and a second sub-layer of the first inorganic film layer which are made of silicon nitride. The first sub-layer of the first inorganic film layer and the second sub-layer of the first inorganic film layer have refractive indexes of 1.80 and 1.76 respectively, and thicknesses of 600 nm and 500 nm respectively.

The second inorganic film layer has sequentially from inside to outside a first sub-layer of the second inorganic film layer and a second sub-layer of the second inorganic film layer which are made of silicon nitride. The first sub-layer of the second inorganic film layer and the second sub-layer of the second inorganic film layer have refractive indexes of 1.87 and 1.83 respectively, and thicknesses of 600 nm and 500 nm respectively.

The display apparatus packaged by the thin-film encapsulation structure of this example is measured under a test condition of a high temperature at 60° C. and a high humidity at 90H that the storage life is 380 h.

As described in the above-mentioned disclosure, storage lives measured in examples according to the present disclosure are compared with those in the comparative examples, as shown in the Table 1 below. Compared with the conventional encapsulation structure in which an inorganic film layer and an organic film layer both having a uniform refractive index are alternately laminated, the thin-film encapsulation structure according to the present disclosure have sub-layers with gradually increasing refractive indexes in the case of the same package thickness, so that the density of the inorganic film layer can be increased. Accordingly, as the refractive indexes of the sub-layers are increased gradually, stresses of the sub-layers are reduced sub-layer by sub-layer, which can significantly improve the moisture and oxygen barrier capabilities of the product, and improve the storage life of the product.

TABLE 1

Comparison of stress and storage life between the examples and the comparative examples

| Serial No. | Storage life/h (60° C. 90 H) |
| --- | --- |
| Example 1 | 760 |
| Example 2 | 870 |
| Example 3 | 760 |
| Example 4 | 760 |
| Comparative Example 1 | 240 |
| Comparative Example 2 | 350 |
| Comparative Example 3 | 350 |
| Comparative Example 4 | 380 |

In the description of the present disclosure, the terms "first" and "second" are used merely for illustrative purposes and are not to be construed as indicating or implying relative importance.

The above embodiments are merely illustrative of several implementations of the disclosure, and the description thereof is more specific and detailed, but should not be deemed as limitations to the scope of the present disclosure. It should be noted that variations and improvements will become apparent to those skilled in the art to which the present disclosure pertains without departing from its scope. Therefore, the scope of the present disclosure is defined by the appended claims.

The invention claimed is:

1. A thin-film encapsulation structure comprising a plurality of inorganic film layers and at least one organic film layer laminated alternately at one side of an organic light-emitting diode, wherein the plurality of inorganic film layers comprises N inorganic film layers, the N inorganic film layers comprising first to N-th inorganic film layers arranged sequentially from inside to outside, N≥2;
   wherein at least the first inorganic film layer is characterized by a refractive index increasing gradually from inside to outside;
   wherein the first inorganic film layer comprises M sub-layers arranged sequentially from inside to outside including a first sub-layer characterized by a first refractive index, a second sub-layer characterized by a second refractive index, and a third sub-layer characterized by a third refractive index;
   wherein the third refractive index is greater than the second refractive index and the second refractive index is greater than the first refractive index.

2. The thin-film encapsulation structure of claim 1, wherein the M sub-layers of the first inorganic film layer are characterized by refractive indexes increasing sub-layer by sub-layer from the first sub-layer to the M-th sub-layer, M≥3;
   wherein a refractive index of the first inorganic film layer is greater than or equal to 1.76 and less than or equal to 1.91.

3. The thin-film encapsulation structure of claim 2, wherein the M sub-layers of the first inorganic film layer are characterized by thicknesses increasing sub-layer by sub-layer from the first sub-layer to the M-th sub-layer.

4. The thin-film encapsulation structure of claim 2, wherein one of the plurality of inorganic film layers positioned closest to the organic light-emitting diode in the thin-film encapsulation structure is the first inorganic film layer.

5. The thin-film encapsulation structure of claim 2, wherein one of the plurality of inorganic film layers farthest from the organic light-emitting diode is the N-th inorganic film layer, and the N-th inorganic film layer has a refractive index ranging from 1.63 to 1.91.

6. The thin-film encapsulation structure of claim 2, wherein the M sub-layers of the first inorganic film layer are homogeneous film layers.

7. The thin-film encapsulation structure of claim 1, wherein each of the plurality of inorganic film layers is characterized by a refractive index increasing gradually from inside to outside.

8. The thin-film encapsulation structure of claim 7, wherein the plurality of inorganic film layers is characterized by refractive indexes increasing layer by layer from the first inorganic film layer to the N-th inorganic film layer.

9. The thin-film encapsulation structure of claim 1, wherein the first sub-layer of the first inorganic film layer is characterized by a refractive index ranging from 1.76 to 1.81.

10. The thin-film encapsulation structure of claim 1, wherein a material of each of the inorganic film layers is any one of SiOx, SiNx, TiO2, Al2O3, or a mixture thereof.

11. A method for manufacturing the thin-film encapsulation structure of claim 1, comprising:
forming the N inorganic film layers and at least one organic film layer alternately at one side of an organic light-emitting diode by a deposition method;
wherein at least the first inorganic film layer is characterized by a refractive index increasing gradually from inside to outside;
wherein a temperature for forming the first inorganic film layer ranges from 30° C. to 60° C.

12. The method of claim 11, wherein the first inorganic film layer comprises M sub-layers comprising first to M-th sub-layers arranged sequentially from inside to outside, M≥2, and the step of forming the first inorganic film layer comprises:
forming at least one sub-layer of the first inorganic film layer adjacent to the organic light-emitting diode by a deposition method.

13. The method of claim 12, wherein the step of forming the first inorganic film layer further comprises:
forming at least one sub-layer of the first inorganic film layer away from the organic light-emitting diode by a deposition method.

14. The method of claim 12, wherein the temperature for forming the first sub-layer ranges from 30° C. to 60° C.

15. The method of claim 11, wherein the step of forming the N inorganic film layers and at least one organic film layer alternately at one side of an organic light-emitting diode by a deposition method, wherein at least the first inorganic film layer has a refractive index increasing gradually from inside to outside comprises:
forming the first inorganic film layer to be closest to the organic light-emitting diode.

16. The method of claim 11, wherein the deposition method is one of a magnetron sputtering method, an atomic layer deposition method, an electron beam evaporation method, a chemical vapor deposition method.

17. A method for manufacturing the thin-film encapsulation structure of claim 1, comprising:
forming the N inorganic film layers and at least one organic film layer alternately at one side of an organic light-emitting diode by a deposition method;
wherein at least the first inorganic film layer is characterized by a refractive index increasing gradually from inside to outside;
wherein the first inorganic film layer comprises M sub-layers comprising first to M-th sub-layers arranged sequentially from inside to outside, M≥2, and the step of forming the first inorganic film layer comprises forming at least one sub-layer of the first inorganic film layer adjacent to the organic light-emitting diode by a deposition method;
wherein the temperature for forming the first sub-layer ranges from 30° C. to 60° C.

* * * * *